(12) United States Patent
Hagihara

(10) Patent No.: US 6,570,243 B1
(45) Date of Patent: May 27, 2003

(54) DUMMY INTERCONNECTS FOR SUPPRESSING THERMALLY GENERATED STRESS CRACKS

(75) Inventor: Hidetoshi Hagihara, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 09/716,431

(22) Filed: Nov. 21, 2000

(30) Foreign Application Priority Data

Dec. 9, 1999 (JP) .......................................... 11-350284

(51) Int. Cl.[7] .......................................... H01L 23/544
(52) U.S. Cl. ....................................... 257/620; 438/926
(58) Field of Search .......................... 257/620; 433/627, 433/926

(56) References Cited

U.S. PATENT DOCUMENTS 5,763,936 A * 6/1998 Yamaha et al. ............. 257/644
5,885,857 A * 3/1999 Yamaha et al. ............. 438/129
6,399,897 B1 * 6/2002 Umematsu et al. ......... 174/261

FOREIGN PATENT DOCUMENTS

JP          8-306771          11/1996

* cited by examiner

*Primary Examiner*—Richard Elms
*Assistant Examiner*—Christian D. Wilson
(74) *Attorney, Agent, or Firm*—Nixon & Vanderhye P.C.

(57) ABSTRACT

A semiconductor device formed of a first dummy interconnect, an interlayer insulating film and a second dummy interconnect which are formed on a semiconductor chip in this order and a plurality of dummy via holes formed in the interlayer insulating film between the first dummy interconnect and the second dummy interconnect; wherein at least one of the first dummy interconnect and the second dummy interconnect is connected with at least two of the dummy via holes.

16 Claims, 3 Drawing Sheets

US 6,570,243 B1

DUMMY INTERCONNECTS FOR SUPPRESSING THERMALLY GENERATED STRESS CRACKS

CROSS-REFERENCE TO RELATED APPLICATION

This application is related to Japanese application No. HEI 11(1999)-350284 filed on Dec. 9, 1999, whose priority is claimed under 35 USC §119, the disclosure of which is incorporated by reference in its entirety.

BACKGROUND OF THE INVENTION

1. Field of the Invention

This invention relates to semiconductor devices, and more particularly to a semiconductor device in which the generation of cracks caused by thermal stress is suppressed in the outer peripheral area of a semiconductor chip.

2. Description of the Related Art

There has been used a resin-molded semiconductor device wherein a semiconductor chip whose surface is covered with a passivation film is sealed with a resin. In the semiconductor device of this type, since the coefficients of thermal expansion of the semiconductor chip and the sealing resin are different, cracks generated in the passivation film by thermal stress may have harmful effects.

Therefore, a method according to which dummy interconnects are formed in the inner pattern region of the semiconductor chip has been proposed with the intention of suppressing the generation of the cracks in the passivation film caused by the thermal stress.

In general, as shown in FIG. 3, the surface of a semiconductor chip includes an inner pattern region 20 which has functional elements such as transistors, interconnects, etc., a region 22 which surrounds the inner pattern region 20 and in which a plurality of bonding pads 21 are arranged, and a reserved region 23 which extends from the outer periphery of the region 22 having the bonding pads 21 arranged therein to the outer periphery of the chip. Each of the bonding pads 21 is, for example, in a rectangular shape whose side is about 100 μm. Besides, the reserved region 23 is a region disposed in order that cracks, which arise from a scribed surface in dicing a semiconductor wafer every chip, may be prevented from reaching the inner pattern region 20 which includes the functional elements. Usually, the reserved region 23 is formed with quite no pattern for functioning in a semiconductor device. More specifically, as shown in FIG. 4, a first interlayer insulating film 24, an SiN film 25 formed by plasma CVD method, an SOG (spin-on-glass) film 26, $SiO_2$ films 27, 28 formed by plasma CVD method, and a passivation film 29 are successively stacked in the reserved region which is located at the outer peripheral part of the semiconductor chip, and they are overlaid with a sealing resin 30.

Usually, the semiconductor device is so constructed that a plurality of wiring layers and interlayer insulating films are stacked as a multilayer wiring structure. Therefore, in order to prevent the damege to the overlying wiring layers, etc. from occurring due to the unevenness of a wafer surface, an SOG film having a flattening effect as the interlayer insulating film is employed in combination with insulating films which are formed by CVD method. The SOG film is formed in such a way that a solution, which is obtained by dissolving an organic silane-based source material in a solvent, is applied onto the wafer surface by spin coating and is heated.

However, when such a semiconductor device is subjected to temperature cycle tests in a temperature range of 150° C. to −65° C. about 500 to 1000 times by way of example, the SOG film 26 peels off at its interfaces with the SiN film 25 and the $SiO_2$ film 27 formed under and over it by the CVD method, as shown in FIG. 5. As a result, cracks may be generated in the SOG film 26.

A semiconductor device to cope with the above drawback has been proposed in, for example, Japanese Patent Application Laid-open HEI 8(1996)-306771. More specifically, as shown in FIG. 6, in the reserved region of a semiconductor chip, an interlayer insulating film 31 is overlaid with a plurality of first dummy interconnects 32, an interlayer insulating film which consists of an SiN film 33, an SOG film 34 and an $SiO_2$ film 35, and second dummy interconnects 36 which are buried in dummy via holes formed in the interlayer insulating film and which are arranged over the dummy via holes. Further, the resulting structure is covered with an $SiO_2$ film 37 and a passivation film 38.

Owing to such a construction, the residual area of the SOG film 34 is, in effect, decreased so as to prevent the SOG film 34 from peeling off the SiN film 33 as well as the $SiO_2$ film 35 and from cracking due to the peeling.

The semiconductor device of the above construction, however, involves the problem that, when the first and second dummy interconnects 32, 36 are patterned in fine or small shapes, it is difficult to prevent the peeling of the interlayer insulating film and the generation of the cracks. Another problem is that steps at the surface of the passivation film 38 enlarge due to the formation of the first and second dummy interconnects 32, 36, so a filler contained in a sealing resin is liable to enter the recess between these interconnects, resulting in the generation of cracks in the passivation film 38 and also in the interconnects 32, 36 themselves. A further problem is that, with some methods for patterning the first and second dummy interconnects 32, 36, stress concentrates in the corner area of the semiconductor chip, causing the generation of cracks in this corner area.

SUMMARY OF THE INVENTION

The present invention provides with a semiconductor device comprising a first dummy interconnect, an interlayer insulating film and a second dummy interconnect which are formed on a semiconductor chip in this order and a plurality of dummy via holes formed in the interlayer insulating film between the first dummy interconnect and the second dummy interconnect; wherein at least one of the first dummy interconnect and the second dummy interconnect is connected with at least two of the dummy via holes.

DESCRIPTION OF THE PREFERRED EMBODIMENTS

Figure 1A:
FIGS. 1(a) through 1(e) are schematic sectional views of essential steps for explaining the fabricating method of a semiconductor device according to the present invention.

A semiconductor device according to the present invention is so constructed that, at least, first dummy interconnects, an interlayer insulating film and second dummy interconnects are stacked on a semiconductor chip in this order.

The "semiconductor chip" used in the present invention signifies a chip which has an integrated circuit of one unit constituting a resin-molded semiconductor device, and which has been divided from a semiconductor substrate (semiconductor wafer) subjected to the series of steps of a manufacturing process in order to function as semiconductor devices. Incidentally, the material of the semiconductor substrate is not especially restricted, and examples mentioned are element semiconductors such as silicon and germanium, and compound semiconductors such as GaAs and ZnSe. Among all, a semiconductor substrate made of silicon is prefarable.

The semiconductor chip may preferably include an element forming region which is formed with an integrated circuit functioning as the semiconductor device and including, for example, functional elements such as transistors, capacitors and resistors, insulating films, wiring layers, etc. in combination, and a chip outer-peripheral region which lies outside the outer periphery of the element forming region and in which insulating films, wiring layers, etc. irrelevant to the functions of the semiconductor device are formed or no constituent is formed. In addition, the semiconductor chip may have a multilayer structure in which the integrated circuit, the insulating films, the wiring layers, etc. are stacked. Alternatively, it may be so constructed that the first and second dummy interconnects and the interlayer insulating film according to the present invention are further overlaid with the integrated circuit, the insulating films, the wiring layers, etc. Still alternatively, it may be so constructed that stacked or multilayer structures each of which consists of the first and second dummy interconnects and the interlayer insulating film are repeatedly stacked.

The shape of the semiconductor chip is not especially restricted, and examples mentioned are a circle; an ellipse; a polygon such as triangle, regular square, rectangle, parallelogram, trapezoid, rhomb, hexagon or octagon; and a substantially polygonal shape in which any of the preceding shapes has its corner cut away or rounded. Among all, a quadrilateral such as the regular square, the rectangle or the rhomb or a substantially quadrilateral shape is suitable.

The "first dummy interconnect" and "second dummy interconnect" signify interconnects which do not function as wiring layers at all. The first dummy interconnect or the second dummy interconnect can be formed of, for example, a single-layer film of a metal such as aluminum, copper, gold, platinum or silver; a refractory metal such as titanium, tantalum or tungsten; polysilicon or the like; a multilayer film of two or more of these materials or a conductive film of any of silicides, poly-cides, etc. of the refractory metal, etc. The first and second dummy interconnects may preferably be formed of the same material and by the same step as those of the electrodes (for example, gate electrode, upper and lower capacitor electrodes, etc.) of the functional elements, the interconnects, etc. which are formed on the semiconductor chip.

Although the first dummy interconnects and the second dummy interconnects may be formed in any region on the semiconductor chip, they may preferably be arranged in the chip outer-peripheral region as stated above. Especially, they may preferably be arranged in an outer peripheral region in the semiconductor chip, except a corner region (refer to FIG. 2). Here, the "corner region" signifies a region in which the concentration of stress is usually conspicuous in the case where the semiconductor chip has been devided after the series of steps of the semiconductor process. Concretely mentioned are a region defining a triangle having, as its two sides, two scribe lines in the semiconductor wafer (two sides of the semiconductor chip), especially a region substantially defining an obtuse-angle (including a right-angle) triangle, preferably a region substantially defining an obtuse-angle isosceles triangle, and more preferably a region defining a right-angled isosceles triangle. By way of example, in a case where the semiconductor chip is in the shape of the regular square or the rectangle, the corner region should preferably be a region substantially defining the right-angled isosceles triangle which is surrounded with two scribe lines and a line intersecting at about 45° to the two scribe lines.

Although each of the first dummy interconnects and second dummy interconnects is not especially restricted in size, it may preferably occupy the largest possible occupation area in the semiconductor chip. Incidentally, the first and second dummy interconnects may have the same size, or the first dummy interconnect may well be larger or smaller than the second dummy interconnect.

Such shapes are not especially restrictive, and the shapes exemplified as those of the semiconductor chip are mentioned as examples. Incidentally, although the shapes of the first dummy interconnect and second dummy interconnect may be either identical or different, these interconnects need to overlap each other through the interlayer insulating film as will be explained later. The extent of the overlap is more preferable as it is larger.

The interlayer insulating film serves to insulate the first and second dummy interconnects between both the interconnects. Mentioned as examples are single-layer films such as an $SiO_2$ film, SiN film, PSG film, BPSG film and SOG film formed by CVD, plasma CVD, low-pressure CVD method, a spin-on-glass method, etc., and multilayer films each consisting of two or more layers thereof. Among all, the SOG film, or a multilayer film of at least 3 layers with the SOG film being sandwiched in is prefarable as the interlayer insulating film. Concretely mentioned is the multilayer film of P-CVD-$SiO_2$ film/SOG film/P-CVD-SiN film. The thickness of the interlayer insulating film is not especially restricted, and it may be, for example, about 500 nm to about 2000 nm.

In the present invention, a plurality of dummy via holes are formed in the interlayer insulating film. Here, the "dummy via hole" signifies a hole which does not serve as a via hole for connecting the interconnects adapted to function as the wiring layers. That is, the "dummy via hole" signifies a hole which is connected with the interconnect not adapted to function as the wiring layer, such as the first or second dummy interconnect. This "dummy via hole" includes any of a hole which is not connected to the interconnect, a hole which is connected with the interconnect only below or above, and a hole which is connected with the interconnects above and below. Here, the "dummy via hole is connected with the interconnect" signifies that the bottom part or top part of the hole is closed up by the interconnect, in other words, that the hole itself is formed in touch with the interconnect.

The dummy via holes are so formed that two or more of them are connected to one dummy interconnect of at least either of the first and second dummy interconnects. Concretely, two or more dummy via holes may be formed on the first dummy interconnect so as to connect one second dummy interconnect to each of the dummy via holes. Alternatively, two or more dummy via holes may be formed on the first dummy interconnect so as to connect one second dummy interconnect to two, three or more of the dummy via holes. Besides, two or more dummy via holes may be formed on the first dummy interconnect so as to connect one second dummy interconnect to all the dummy via holes. In addition, two or more dummy via holes may be formed beneath the second dummy interconnect so as to connect one first dummy interconnect to each of the dummy via holes. Further, two or more dummy via holes may be formed beneath the second dummy interconnect so as to connect one first dummy interconnect to two, three or more of the dummy via holes.

The size, shape, etc. of the dummy via hole are not especially restricted. Mentioned as examples are a cross-sectional area of about 0.1 $\mu m^2$ to about 10 $\mu m^2$, and a cross-sectional shape such as triangle, quadrilateral, circle or pentagram. Besides, the dummy via hole may preferably be connected with the largest possible areas of the first and second dummy interconnects.

Although the dummy via holes may be hollow, they may preferably be buried with an insulating material or a conductive material, especially with the conductive material. The conductive material is not especially restricted, and any of the materials exemplified for the first and second dummy interconnects may be employed. Incidentally, the conductive material need not always be the same as the material forming the first or second dummy interconnects, and the dummy via holes may be buried with a different material or with a conductive material such as barrier metal. Among all, the material forming the second dummy interconnects is suitably employed by directly burying it in the dummy via holes.

Now, an embodiment of a semiconductor device according to the present invention will be described with reference to the drawings.

Figure 1B:
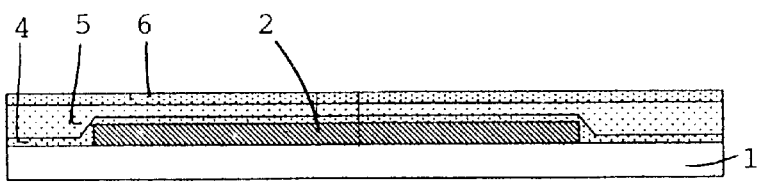
Figure 1C:
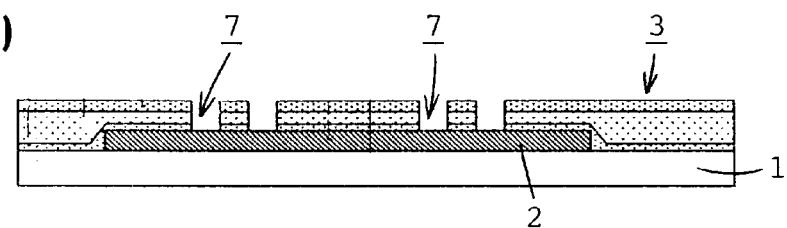
Figure 1D:
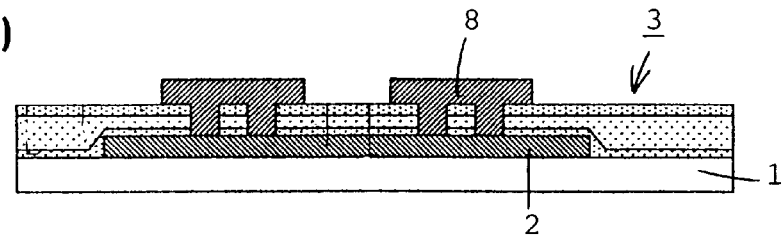
Figure 1E:
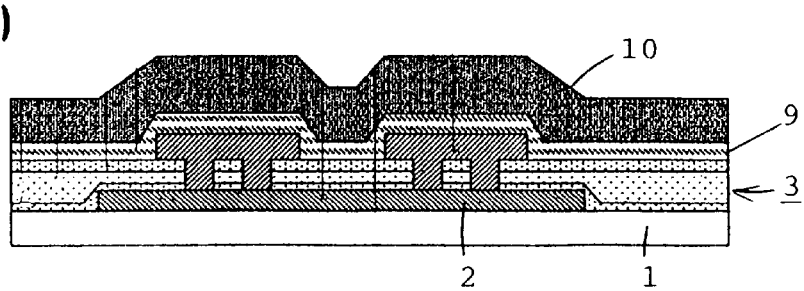
Figure 2:
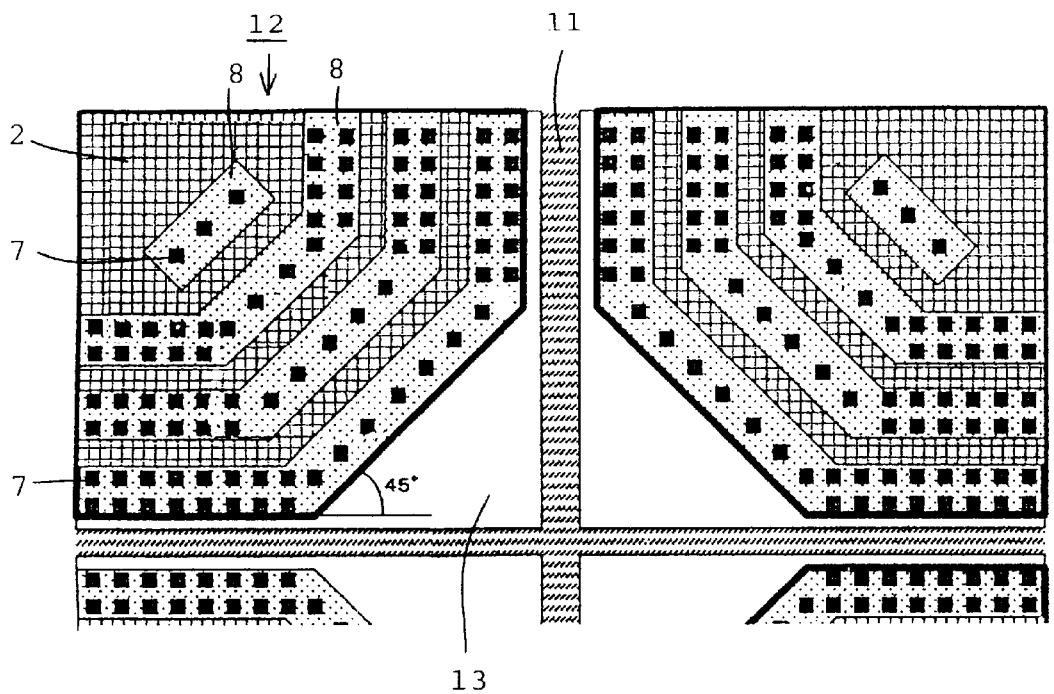
FIG. 2 is a schematic plan view of essential portions showing the outer peripheral area of a chip in the semiconductor device according to the present invention.
Figure 3:
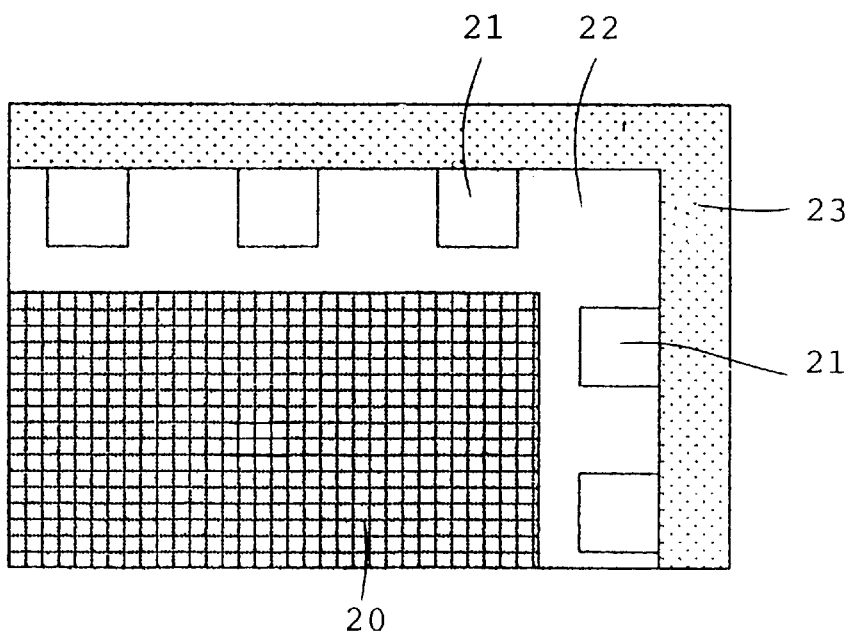
FIG. 3 is a schematic plan view of the essential portions of a semiconductor chip formed with a conventional semiconductor device.
Figure 4:
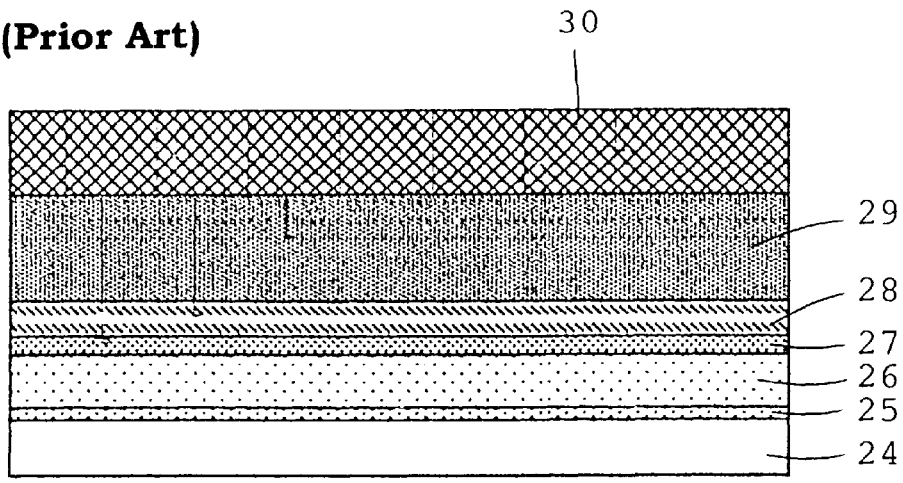
FIG. 4 is a schematic sectional view of a reserved region in the conventional semiconductor device.
Figure 5:
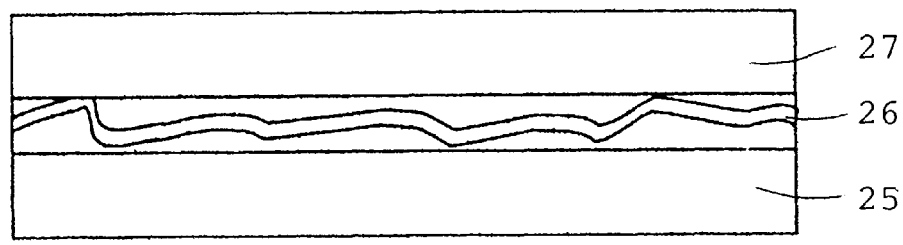
FIG. 5 is a schematic sectional model diagram for explaining the peeling and cracking of an SOG film at the interfaces thereof with an SiN film, an SOG film and an $SiO_2$ film in the conventional semiconductor device.
Figure 6:
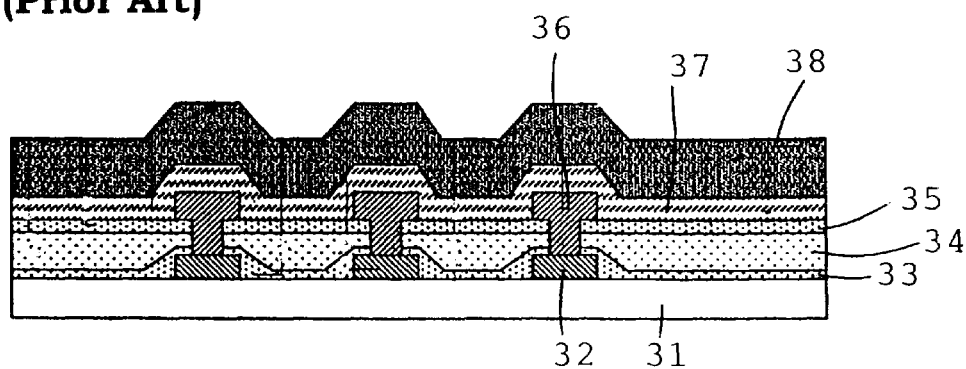
FIG. 6 is a schematic sectional view of the essential portions of another conventional semiconductor device.

As shown in FIG. 1(e) and FIG. 2, the semiconductor device includes an inner pattern region (not shown) formed with functional elements etc., and the outer-peripheral region 12 of a semiconductor chip, lying outside the inner pattern region, within each of semiconductor chips which are isolated by scribe lines 11 in a silicon wafer.

In the chip outer-peripheral region 12, first dummy interconnects 2, an interlayer insulating film 3 and second dummy interconnects 8 are stacked in this order. Dummy via holes 7 are formed in those parts of the interlayer insulating film 3 at which the second dummy interconnects 8 overlap the first dummy interconnects 2. Each of the first dummy interconnects 2 is connected with two or more of the dummy via holes 7, through which it is further connected with two or more of the second dummy interconnects 8.

Besides, the first and second dummy interconnects 2, 8 and the dummy via holes 7 are formed so that a corner region 13 which is substantially in the shape of a right-angled isosceles triangle having an angle of 45° may be left at the part of the chip outer-peripheral region 12 corresponding to the corner of the semiconductor chip. Incidentally, the interlayer insulating film 3 is not existent on the region 13 and only a passivation film to be stated later is existent.

In the example of FIG. 2, the semiconductor chip is substantially in the shape of a quadrilateral having a size of about 10×10 mm, the length of each latus of the dummy via hole 7 is about 1.0 $\mu m$, the line width of the second dummy interconnect 8 is about 5.0 $\mu m$, the area of the first dummy interconnect 2 is about 10000 $\mu m^2$, and the area of the corner region 13 is about 1500 $\mu m^2$.

Such a semiconductor device can be formed by a manufacturing method explained below.

Firstly, as shown in FIG. 1(a), a first interlayer insulating film 1 is formed on the whole surface of a silicon wafer (not shown) in which desired functional elements and wiring layers are formed in an inner pattern region by a known method. By way of example, the interlayer insulating film 1 is formed into a multilayer structure which consists of a PSG (phosphosilicate glass) film having a thickness of about 100 nm and a BPSG (borophosphosilicate glass) film having a thickness of about 750 nm, in conformity with low-pressure CVD method and by reflowing the BPSG film at about 1000° C.

Subsequently, in the inner pattern region, contact holes (not shown) are formed in the first interlayer insulating film 1 in order to secure leading-out lines from the functional elements, and a conductive film is buried in the contact holes and is extended on the whole surface of the silicon wafer. By way of example, the conductive film is formed by sputtering into a three-layer structure which consists of a TiW film having a thickness of about 150 nm, an AlSi film having a thickness of about 500 nm and a TiN film having a thickness of about 150 nm. Thereafter, the whole surface of the conductive film is spin-coated with a resist film (not shown), and a resist pattern (not shown) is formed via exposure and development steps. Using the resist pattern as an etching mask, the conductive film is patterned to form a first wiring layer (not shown) in the inner pattern region, and bonding pads (not shown), a wiring pattern (not shown) for metal sealing and a first dummy wiring pattern 2 in a chip outer-peripheral region.

At the next step, a second interlayer insulating film 3 is formed on the whole surface of the resulting silicon wafer as shown in FIG. 1(b). The second interlayer insulating film 3 is formed of a multilayer film which consists of an SiN film 4 being about 250 nm thick, an SOG film 5 being about 500 nm thick and an $SiO_2$ film 6 being about 500 nm. Incidentally, the SiN film 4 and the $SiO_2$ film 6 are formed by plasma CVD method, while the SOG film 5 is formed by spin-coating the surface of the SiN film 4 with a solution, which is obtained by dissolving an organic silane-based source material in a solvent, and then curing the solution at a temperature of about 400° C.

Next, a resist pattern (not shown) is formed on the whole surface of the resulting silicon wafer in the same way as stated above. Using the resist pattern as an etching mask, the second interlayer insulating film 3 is etched to form via holes (not shown) for leading out the first wiring layer in the inner pattern region, and dummy via holes 7 on the dummy wiring pattern 2 as shown in FIG. 1(c), in the chip outer-peripheral region. Incidentally, the dummy via holes 7 are formed so that two or more of them may lie on the identical first dummy wiring pattern 2.

Subsequently, a conductive film as a three-layer structure, which consists of a TiN film having a thickness of about 30 nm, an AlSi film having a thickness of about 100 nm and a TiW film having a thickness of about 150 nm, is formed on the whole surface of the resulting silicon wafer by sputtering by way of example. Thereafter, the whole surface of the conductive film is spin-coated with a resist film (not shown), and a resist pattern (not shown) is formed via exposure and development steps. Using the resist pattern as an etching mask, the conductive film is patterned to form a second wiring layer in the inner pattern region, and to bury the dummy via holes 7 with the conductive film and to form the patterns of second dummy interconnects 8 over the dummy via holes 7 as shown in FIG. 1(d), in the chip outer-peripheral region. When the pattern of each of the second dummy interconnects 8 is connected with two or more of the dummy via holes 7 in this manner, the effect of preventing peeling in the second interlayer insulating film 3 is enhanced.

Further, as shown in FIG. 1(e), an SiO$_2$ film 9 having a thickness of about 400 nm and an SiN film 10 having a thickness of about 600 nm are successively formed on the whole surface of the resulting silicon wafer by plasma CVD method. Incidentally, the SiN film 10 fulfills the function of the passivation film.

Subsequently, a resist pattern (not shown) is formed on the whole surface of the resulting silicon wafer in the same way as stated above. Using the resist pattern as an etching mask, the SiN film 10 is etched to expose the bonding pads (not shown) and scribe regions (not shown). The resulting silicon wafer is scribed every chip by employing a dicing saw.

Thereafter, each semiconductor chip is die-bonded to a lead frame, and wire bonding for connecting the bonding pads with the lead terminals of the lead frame is carried out. The semiconductor device is finished up as a resin-molded semiconductor device via such steps as sealing with a resin, molding, and stamping.

With the semiconductor device finished up via the series of steps thus far described, the peeling and cracking of the SOG film based on thermal cycle tests have been suppressed as compared with those in the prior-art semiconductor device.

The present invention brings forth effects as stated below.

According to the present invention, each of first dummy interconnects or second dummy interconnects is connected with a plurality of dummy via holes. Therefore, the close adhesion of an interlayer insulating film can be enhanced by the first and second dummy interconnects of comparatively large line widths, thereby to prevent the peeling of the interlayer insulating film held between the interconnects and to prevent the propagation of cracks within the interlayer insulating film, so that a semiconductor device of high reliability can be obtained.

Moreover, in a case where the dummy via holes are buried with a conductive film, the conductive film fulfills the function of a cramp for the interlayer insulating film, conjointly with the first and second dummy interconnects, so that the close adhesion of the interlayer insulating film can be enhanced more.

Further, in a case where the first and second dummy interconnects and the dummy via holes are arranged in an outer peripheral region, it is permitted to provide a semiconductor device of high reliability without incurring restrictions to the design of a semiconductor chip, etc.

Besides, in a case where the outer peripheral region is one except a corner region, especially except a region being substantially in the shape of a right-angled isosceles triangle the two latera of which are the two adjacent latera of the semiconductor chip, the first and second dummy interconnects can avoid the influence of stress, so that the close adhesion of the interlayer insulating film can be enhanced more.

Moreover, in a case where the first and second dummy interconnects are formed of the same material and by the same step as those of the interconnects in an element forming region, and where the dummy via holes are formed by the same step as that of via holes in the element forming region, the close adhesion of the interlayer insulating film can be enhanced without increasing the number of steps in a conventional semiconductor process. It is therefore permitted to enhance available percentage, in turn, to curtail a manufactural cost, and to provide a semiconductor device of high reliability less expensively.

What is claimed is:

1. A semiconductor device comprising:
   a plurality of first dummy interconnects, an interlayer insulating film and a plurality of second dummy interconnects are formed on a semiconductor chip in this order,
   wherein a plurality of dummy via holes are defined in the interlayer insulating film between the first dummy interconnects and the second dummy interconnects; and
   wherein at least one of the second dummy interconnects is connected to one of the first dummy interconnects by way of at least two of the dummy via holes.

2. A semiconductor device according to claim 1, wherein the dummy via holes are buried with a conductive material.

3. A semiconductor device according to claim 2, the conductive material is the same material made of the second dummy interconnect.

4. A semiconductor device according to claim 1, wherein the interlayer insulating film is made of a single-layer film, an SOG film, and/or a multilayered film which contains an SOG film.

5. A semiconductor device according to claim 1, wherein the semiconductor chip has an element forming region formed with functional elements and an outer peripheral region laid outside of the element forming region, and the first and second dummy interconnects and the dummy via holes are arranged in the outer peripheral region.

6. A semiconductor device according to claim 5, wherein the outer peripheral region is an outer peripheral region except a corner region thereof.

7. A semiconductor device according to claim 6, wherein the corner region is substantially in the shape of a right-angled isosceles triangle whose two sides coinside with two adjacent sides of the semiconductor chip.

8. A semiconductor device according to claim 5, wherein the first and second dummy interconnects are formed of the same material by the same step as a interconnects is formed in the element forming region, and the dummy via holes are formed by the same step as via holes are formed in the element forming region.

9. The semiconductor device of claim 1, wherein the interlayer insulating film between the first dummy interconnects and the second dummy interconnects comprises at least first, second and third insulating layers.

10. The semiconductor device of claim 1, wherein in addition to said interlayer insulating film between the first and second dummy interconnects, the semiconductor device further comprises a second interlayer insulating film located below each of the first and second dummy interconnects and a third interlayer insulating film located above each of the first and second dummy interconnects.

11. The semiconductor device of claim 1, wherein two or more dummy via holes are defined in the interlayer insulating film over one of the first dummy interconnects so that one of the second dummy interconnects is connected to one of the first dummy interconnects via each of the two or more dummy via holes defined in the interlayer insulating film over the one first dummy interconnect.

12. The semiconductor device of claim 1, wherein two or more dummy via holes are defined in the interlayer insulating film beneath one of the second dummy interconnects so that the one second dummy interconnect is connected to one of the first dummy interconnects via all of the via holes defined in the interlayer insulating film beneath the one second dummy interconnect.

13. A semiconductor device comprising:
- a plurality of first dummy interconnects, an interlayer insulating film and a plurality of second dummy interconnects are formed on a semiconductor chip in this order in at least part of a peripheral region thereof;
- wherein a plurality of dummy via holes are defined in the interlayer insulating film between the first dummy interconnects and the second dummy interconnects; and
- wherein at least one of the first dummy interconnects is connected to one of the second dummy interconnects by way of at least two of the dummy via holes.

14. The semiconductor device of claim 13, wherein in addition to said interlayer insulating film between the first and second dummy interconnects, the semiconductor device further comprises a second interlayer insulating film located below each of the first and second dummy interconnects and a third interlayer insulating film located above each of the first and second dummy interconnects.

15. The semiconductor device of claim 13, wherein two or more dummy via holes are defined in the interlayer insulating film over one of the first dummy interconnects so that one of the second dummy interconnects is connected to one of the first dummy interconnects via each of the two or more dummy via holes defined in the interlayer insulating film over the one first dummy interconnect.

16. The semiconductor device of claim 13, wherein two or more dummy via holes are defined in the interlayer insulating film beneath one of the second dummy interconnects so that the one second dummy interconnect is connected to one of the first dummy interconnects via all of the via holes defined in the interlayer insulating film beneath the one second dummy interconnect.

* * * * *